(12) United States Patent
Liu et al.

(10) Patent No.: US 6,262,475 B1
(45) Date of Patent: Jul. 17, 2001

(54) LEAD FRAME WITH HEAT SLUG

(75) Inventors: Wen-Chun Liu, Pingtung Hsien; Chih-Kung Huang, Hsin-Chu, both of (TW)

(73) Assignees: Walsin Advanced Electronics Ltd., Kaohiung; Sitron Precision Co., Ltd., Hsinchu, both of (TW)

( * ) Notice: Subject to any disclaimer, the term of this patent is extended or adjusted under 35 U.S.C. 154(b) by 0 days.

(21) Appl. No.: 09/250,985

(22) Filed: Feb. 16, 1999

(30) Foreign Application Priority Data

Nov. 27, 1998 (TW) ................................................ 87119711

(51) Int. Cl.[7] .................................................. H01L 23/02
(52) U.S. Cl. .......................... 257/675; 257/666; 257/670; 257/706; 257/796; 257/692; 257/696; 257/676; 361/813; 361/831
(58) Field of Search ..................................... 257/675, 666, 257/670, 796, 706, 676, 692, 696; 361/723, 813, 831

(56) References Cited

U.S. PATENT DOCUMENTS 5,703,399 * 12/1997 Majmudar et al. ................... 257/723

6,018,191 * 1/2000 Murakami et al. ................... 257/691
6,064,115 * 5/2000 Moscicki ............................. 257/706
6,115,254 * 9/2000 Kinsman et al. .................... 361/704

FOREIGN PATENT DOCUMENTS

360138944 * 7/1985 (JP) ......................................... 23/36
360138945 * 7/1985 (JP) ......................................... 23/36
404022159 * 1/1992 (JP) ......................................... 23/50
360148153 * 8/1995 (JP) ......................................... 23/36

* cited by examiner

Primary Examiner—Tom Thomas
Assistant Examiner—Nitin Parekh
(74) Attorney, Agent, or Firm—Jiawei Huang; J.C. Patents

(57) ABSTRACT

The addition of a heat slug to a lead frame establishes a heat conduction path from a silicon chip on the lead frame to the heat slug. Hence, when a semiconductor package that encloses the lead frame and the silicon chip is formed, heat produced by the silicon chip can still be channeled away through the radiating surface of the heat slug. Furthermore, the heat slug can be bent over to cover burrs outside the package.

18 Claims, 8 Drawing Sheets

LEAD FRAME WITH HEAT SLUG

CROSS REFERENCE TO RELATED APPLICATION

This application claims the priority benefit of Taiwan application serial no. 87119711, filed Nov. 27, 1998, the full disclosure of which is incorporated herein by reference.

BACKGROUND OF THE INVENTION

1. Field of Invention

The present invention relates to a type of lead frame used in the packaging of an IC chip. More particularly, the present invention relates to a lead frame with an additional heat slug that can serve as a radiating surface outside the IC package. In addition, the heat slug is able to hide burrs outside the package so that there is less problem in transporting the package.

2. Description of Related Art

In the manufacturing of semiconductor IC, packaging is the last but also one of the more critical steps in producing a reliable product. In IC packaging, a fully functional IC chip is mounted onto an IC lead frame. Then, the IC chip is electrically connected to the internal lead section of the lead frame. After connection to the internal leads, the chip and internal wiring are sealed, the external leads of a complete IC package can be electrically connected to appropriate terminals on a printed circuit board (PCB). Hence, the IC package and the PCB are combined into one big operating circuit.

FIG. 1 is a schematic, perspective view of an IC package using a conventional lead frame. FIG. 2 is a schematic, top view showing the internal layout of a conventional lead frame. As shown in FIGS. 1 and 2, a lead frame has a sheet-like structure that can be roughly divided into a planar region and leads region. The planar region is usually referred to as a bar pad or a die pad 10. The die pad 10 is used for mounting a silicon chip. The leads region is often subdivided further into an internal lead section 15 and an external lead section 25. Alternatively, a lead frame can be divided up into a packaging area 50 (area enclosed within centered lines) and an external area. In fact, the package area 50 is the place in which the silicon chip, the wiring and lead frame are eventually sealed off. To increase the degree of automation, various lead frames are placed side by side using with the help of two side rails 30.

The conventional method of packaging an IC chip includes placing a silicon chip onto a die pad 10, and then fixing the chip in place with die attach material. Next, the bonding pads on a silicon chip are connected to the respective leads by metallic wires through a wire bonding operation. Most often gold or aluminum wires are used. Thereafter, the lead frame is placed inside a set of molds, and the packaging area 50 is sealed off using epoxy molding compound. Finally, the external portion of the leads are trimmed and then formed into the desired shape, thereby producing a complete IC package.

As shown in FIG. 2, end flashes come out between the leads at the boundary of the packaging area 50. Even after the side rails 30 are cut off, traces of these flashes can still be seen. These end flashes are often referred to as burrs 80 (FIG. 1). As long as the packaging area 50 of a lead frame is sealed by injection molding material into a mold cavity, some of the injected material is bound to leak out from the junction between the molds and the lead frame. Hence, these burrs are unavoidable. Although some of these burrs can be removed in a subsequent operation, the removal process adds to the cost of production.

Moreover, some burrs remain on the package in spite of the use of high-precision deburring tools. After IC packages are separated from each other, each IC unit is individually transported to an automatic testing through a vibrator, and then is carried on along a track to a packaging station. In general, the IC packages line up close to each other along the track. However, burrs 80 outside the package may increase friction, so that when they rub against each other and against the tracks, some of the packages may be displaced, thereby jamming the tracks. Hence, a lot of production time is wasted simply to clear the jammed tracks.

Another genuine problem of IC package is the vast amount of heat generated when a silicon chip inside the package is operating a full capacity. The heating problem is becoming more serious, especially as the level of integration on a semiconductor substrate continues to increase and the processing power of a silicon chip continues to multiply.

As shown in FIG. 2, the entire packaging area 50 is enclosed. Therefore, any heat generated internally has to pass out by heat conduction through the packaging material. Since most packaging material is generally a good insulator or a poor heat conductor, heat conduction particularly difficult. To boost of the amount of heat dissipated through an IC package, sometimes a sheet of radiating metal is attached to the lead frame before sealing. Hence, heat generated by the silicon chip can be conducted away through the radiating surface of the metal sheet. However, adding a radiator not only increases the complexity of the packaging operation, but both material cost and production cost increase as well.

In light of the foregoing, there is a need to provide a better lead frame design that can remove more heat and prevent the resulting semiconductor package from jamming tracks.

SUMMARY OF THE INVENTION

Accordingly, the purpose of the present invention is to provide a lead frame design capable of dissipating more heat away from a highly integrated silicon chip within a semiconductor package.

In another aspect, purpose of the invention is to provide a lead frame design capable of reducing burrs outside a semiconductor package so that the package can be easily transported along tracks to testing, packaging or other operating stations.

To achieve these and other advantages and in accordance with the purpose of the invention, as embodied and broadly described herein, the invention provides a lead frame with an additional heat slug attached to its packaging area. The heat slug is connected to a silicon chip through a die pad or a bus bar so that heat generated from the silicon chip can be channeled to the heat slug and then radiated away to the atmosphere. Since no extra operations are required to set up the heat slug, no additional manufacturing equipment is necessary. Hence, the lead frame does not incur additional fabricating cost.

In addition, the heat slug of the lead frame emerges outside the plastic package. After the heat slug is bent around the package body, burrs formed outside the semiconductor package during the packaging operation are hidden. Therefore, transportation problems caused by the presence of burrs in the package are prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
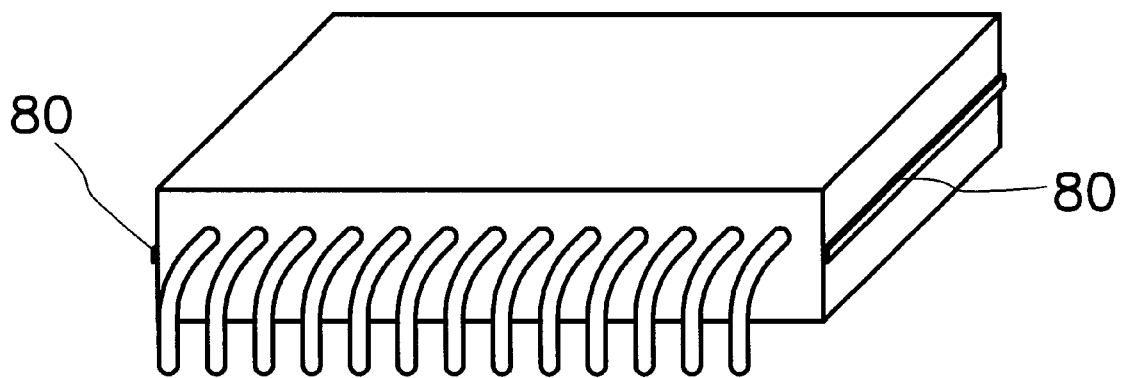
FIG. 1 is a schematic, perspective view of an IC package using a conventional lead frame.
Figure 2:
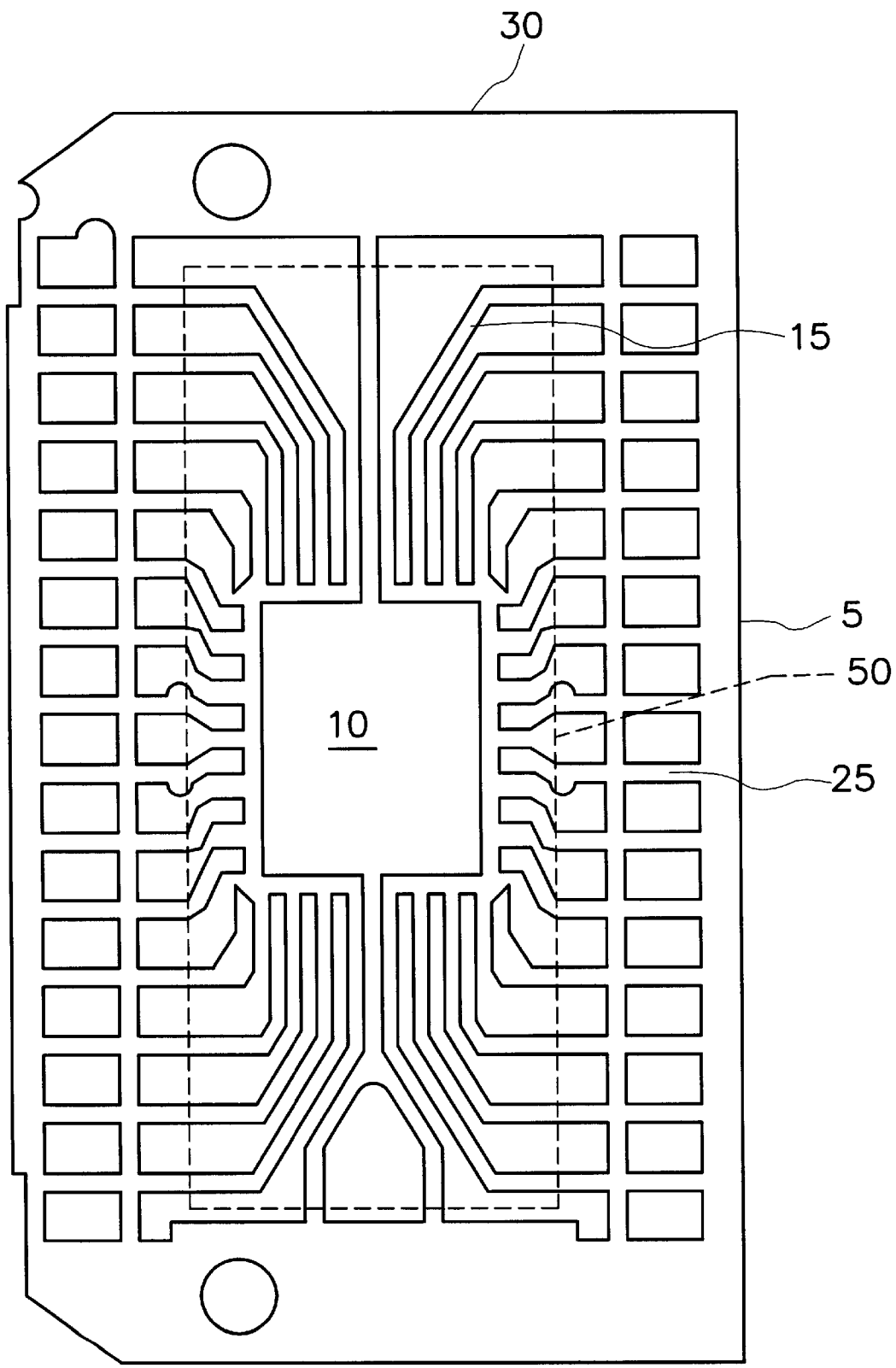
FIG. 2 is a schematic, top view showing the internal layout of a conventional lead frame.

Reference will now be made in detail to the present preferred embodiments of the invention, examples of which are illustrated in the accompanying drawings. Wherever possible, the same reference numbers are used in the drawings and the description to refer to the same or like parts.

Figure 3:
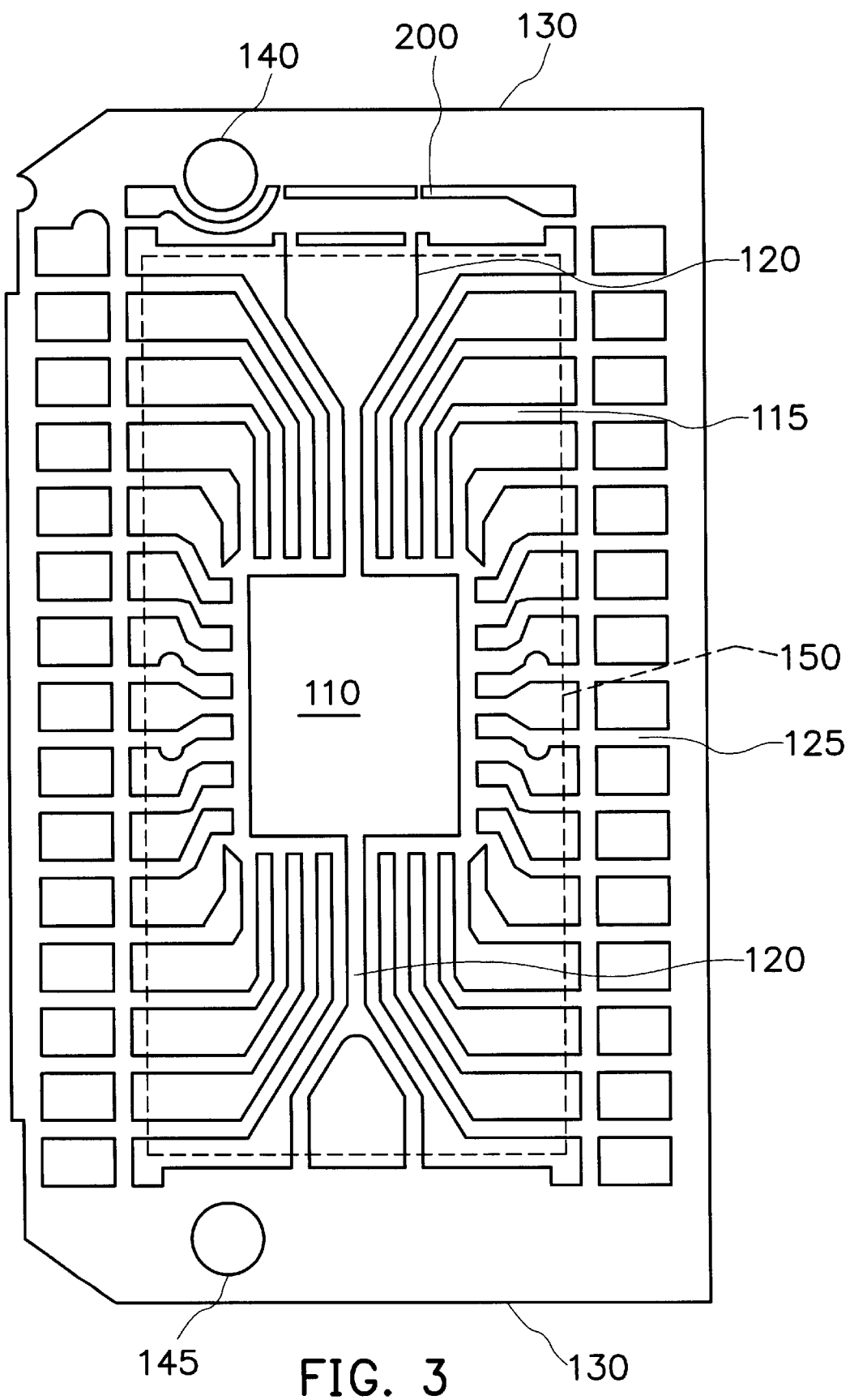
FIG. 3 is a schematic, top view showing the internal layout of a lead frame with a heat slug according to the first preferred embodiment of this invention.

FIG. 3 is a top view showing the internal layout of a lead frame with a heat slug according to the first preferred embodiment of this invention. As shown in FIG. 3, the upper and lower end of the lead frame is coupled to a side rail 130. Therefore, multiple lead frames can be lined up next to each other, and production can be fully automated. The die pad 110 is used for mounting a silicon chip. The die pad 110 is anchored with respect to the side rails 130 through two tie bars 120. In addition, there are indexing holes 140 and guiding holes 145 on the side rails 130 for recognizing the lead positions and for driving the lead frames around. The rectangular packaging area 150 to be sealed off during a plastic molding operation is the region enclosed by the dashed lines in FIG. 3.

Figure 4:
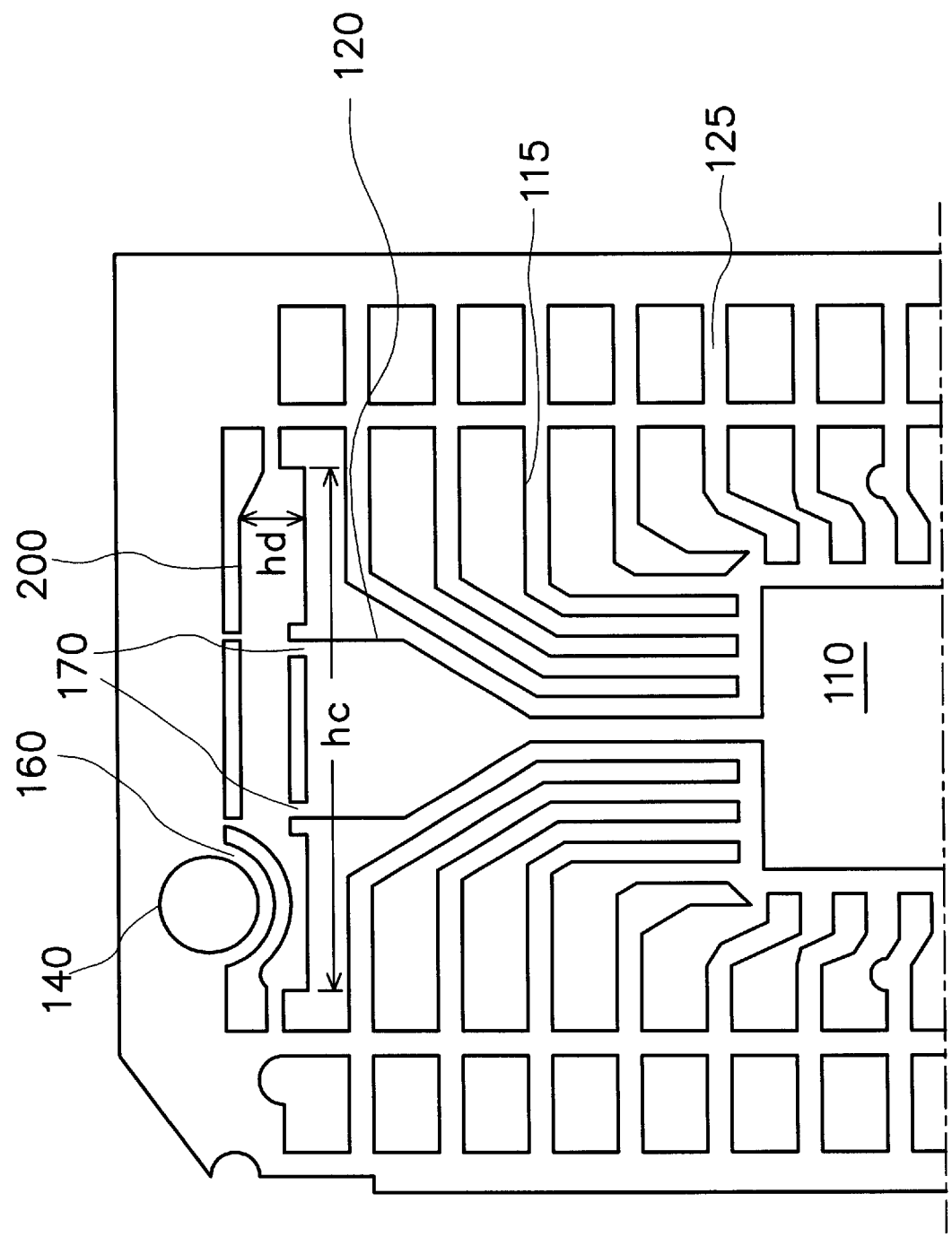
FIG. 4 is an enlarged view of a portion of the lead frame as shown in FIG. 3.

FIG. 4 is an enlarged view of a portion of the lead frame as shown in FIG. 3. As shown in FIG. 4, there is a heat slug 200 between the tie bar 120 and the side rail 130. After packaging, the heat slug 200 serves to radiate away the heat generated by the enclosed silicon chip. Because of the presence of an indexing hole 140 or a guiding hole 145 on the side rail 130, a portion of the heat slug 200 is truncated as shown in the area labeled 160 of FIG. 4. However, no matter what the ultimate shape of the heat slug 200, the radiating surface of the heat slug 200 is capable of increasing the amount of heat channeled away to the atmosphere. Furthermore, the affected portion 160 of the heat slug 200 can be tailored to the need for heat dissipation. Moreover, additional heat slugs 200 can be attached at various points around the lead frame.

In addition, if the portion for connecting the heat slug 200 and the tie bar 120 is a single piece, a large bending stress is created after the heat slug 200 is bent. Hence, it is much more difficult to control the final form that the heat slug 200 may take after bending. Moreover, if there is only a single point of connection, the heat slug 200 can easily shift out of place or even be broken off from the lead frame.

Therefore, there are two connecting points 170 linking the heat slug 200 with the tie bar 120. Nevertheless, anyone familiar with IC packaging may understand that various combinations of shapes, slots, holes and connecting points transition zones between the heat slug 200 and the packaging area 150 are possible. Therefore, the heat slug 200 can be formed into almost any shape after the package is made.

Figure 5:
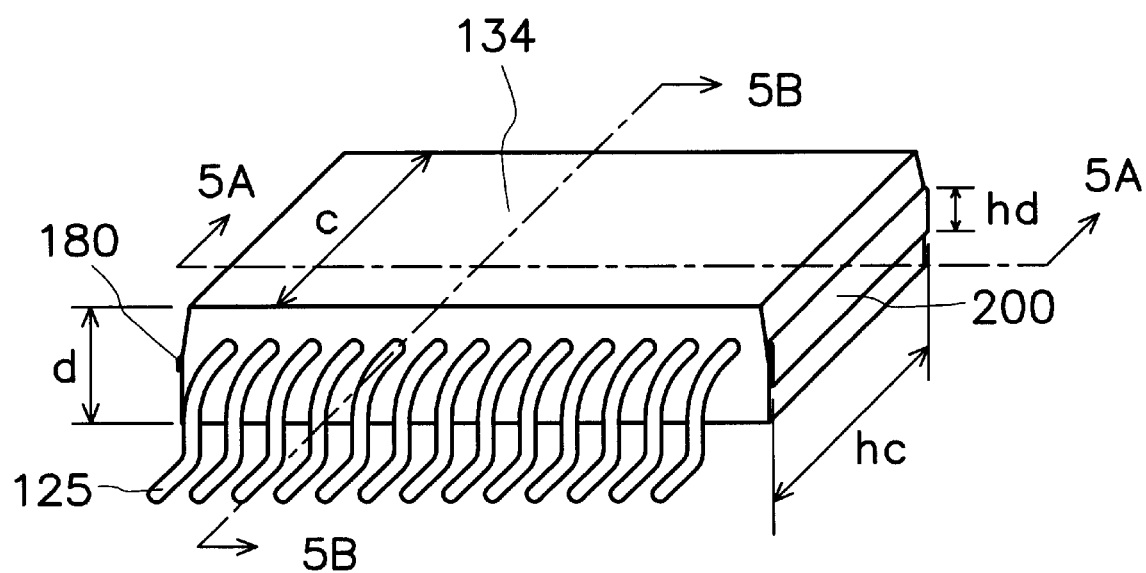
FIG. 5 is a schematic, perspective view of a semiconductor package incorporating the lead frame as shown in FIG. 3.
Figure 5A:
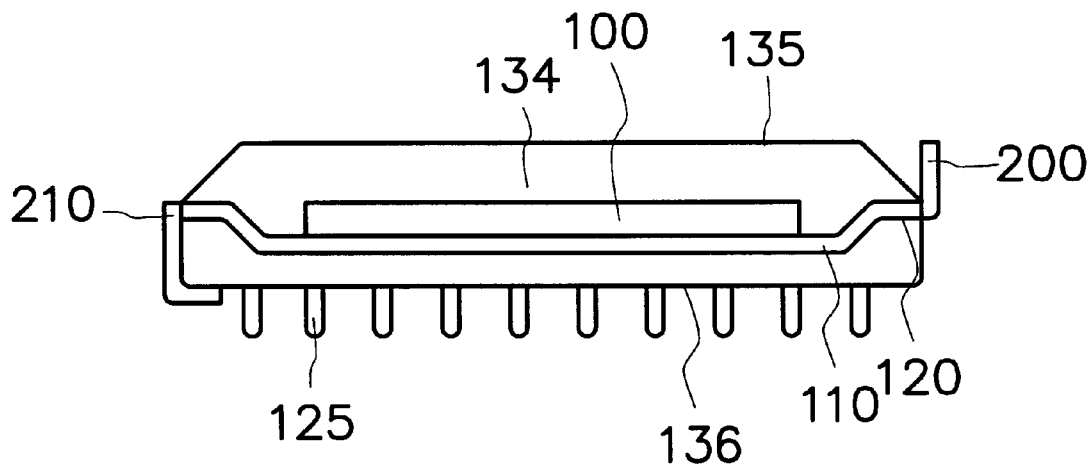
FIG. 5A is a schematic, cross-sectional, side view of a semiconductor package along line 5A—5A of FIG. 5.
Figure 5B:
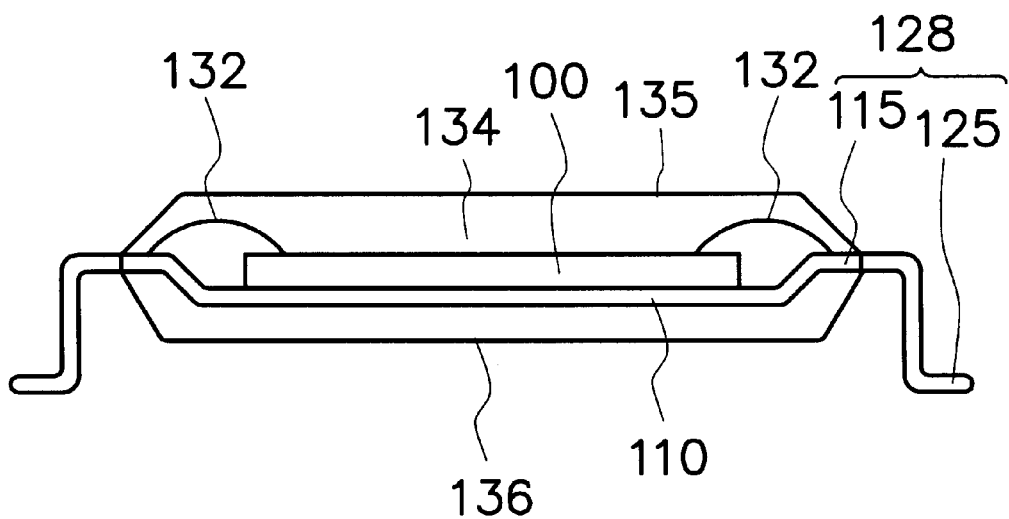
FIG. 5B is a schematic, cross-sectional, side view of a semiconductor package along line 5B—5B of FIG. 5.

FIG. 5 is a schematic, perspective view of a semiconductor package incorporating the lead frame as shown in FIG. 3. FIG. 5A is a schematic, cross-sectional, side view of a semiconductor package along line 5A—5A of FIG. 5. FIG. 5A is a schematic, cross-sectional, side view of a semiconductor package along line 5B—5B of FIG. 5. The method of forming a semiconductor package includes the steps of attaching a silicon chip 100 to the surface of a die pad 110. Then, a wire bonding operation is performed. Conductive wires 132 such as gold or aluminum wires span the distance from a bonding pad (not shown in the figure) on the silicon chip 100 to the internal lead section 115 of a leads 128.

Thereafter, a packaging material such as epoxy molding compound is used to seal off the internal lead section 115 of the lead frame, the die pad 110 and the silicon chip 100, thereby creating an oblong package body 134. The heat slug 200 emerges from the side of the package. The exposed heat slug is connected to the die pad 110 via a tie bar 120. The heat slug 200 is subsequently bent either up or down so that burrs 180 resulting from bled-out packaging material between mold junctions are covered. Consequently, the semiconductor package is less vulnerable to jamming or displacement inside the tracks that lead to a testing or a packaging station.

The heat slug 200 has a width of hd (FIG. 4) and a length of hc (FIG. 4), and the length hc of the heat slug 200 is smaller than the width c (FIG. 5) of the package 134. Furthermore, the lead frame can have on heat slug 200 emerging on just one side of the package 134, but can have an additional heat slug 210 emerging on the other side as well.

In addition, each heat slug that emerges from the package body 134 can be independently selected to bend either up towards the upper surface 135 of the package body 134 or down towards the lower surface 136 independently. If the heat slug is bent down towards the lower surface 136 of the package 134, it is possible for it to make contact with a printed circuit board (PCB), which further enhances the rate of heat dissipation.

In case there is insufficient area on the PCB for the heat slugs 200 and 210 to make contact, they can still extend to the upper surface 135 or the lower surface 136. In either case, the total radiating areas still increases.

Figure 6:
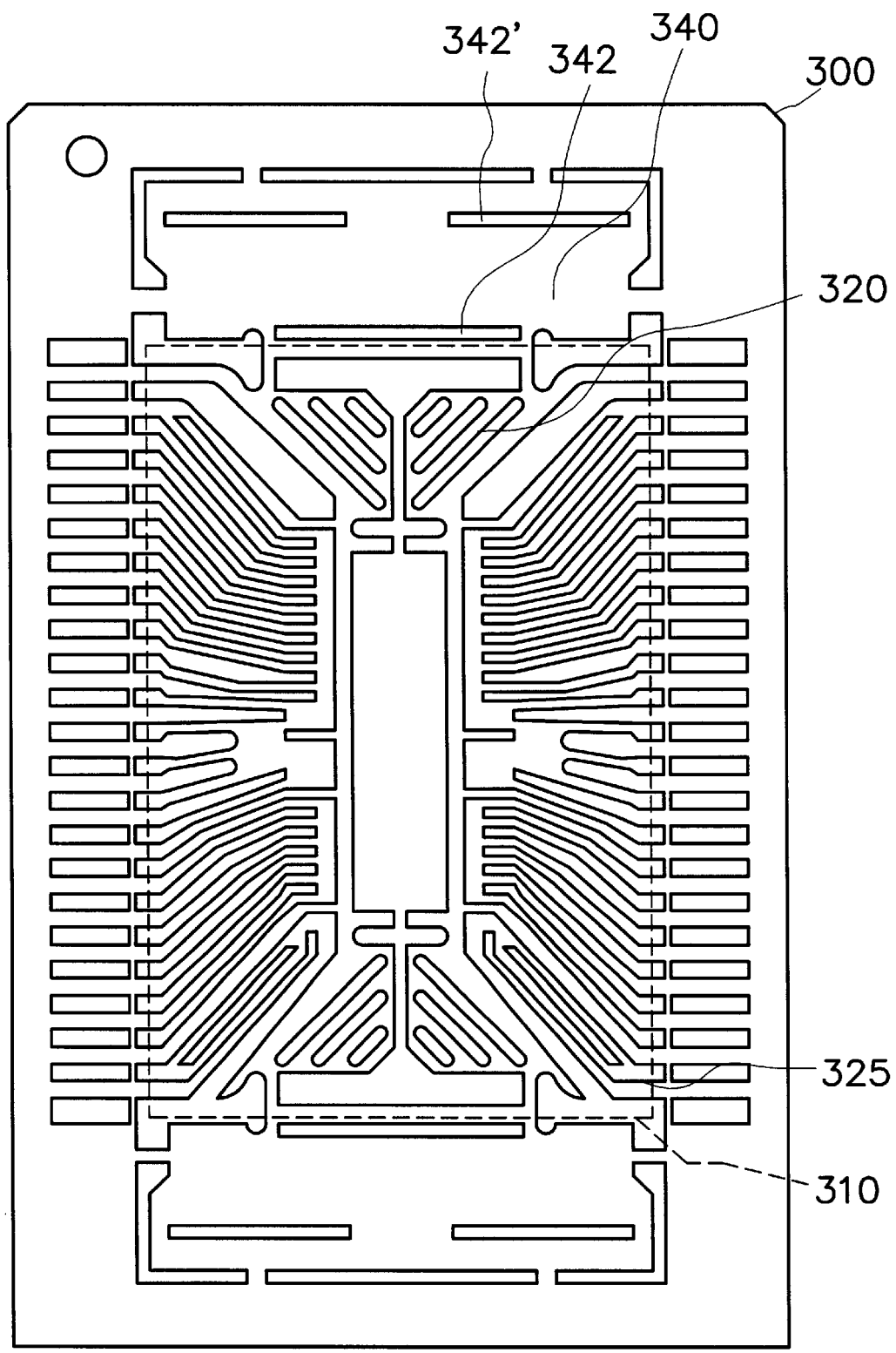
FIG. 6 is a schematic, top view showing the internal layout of a lead frame with a heat slug according to the second preferred embodiment of this invention.

FIG. 6 is a schematic, top view showing the internal layout of a lead frame with a heat slug according to the second preferred embodiment of this invention. In FIG. 6, a lead frame 300 to be used in a chip scale package is shown. The packaging area 310 of a chip scale package is only about 1.1 to 1.2 times the area of the silicon chip. Furthermore, there is no die pad and hence no tie bars for connecting with the die pad. The silicon chip is positioned either above or below the lead frame 300, and is supported by internal leads 325 and supporting frames 320. The supporting frame 320 and the heat slug 340 are connected together. Therefore, any heat generated by the silicon chip can be conducted to the heat slug 340 and then radiated away to the atmosphere.

Figure 6A:
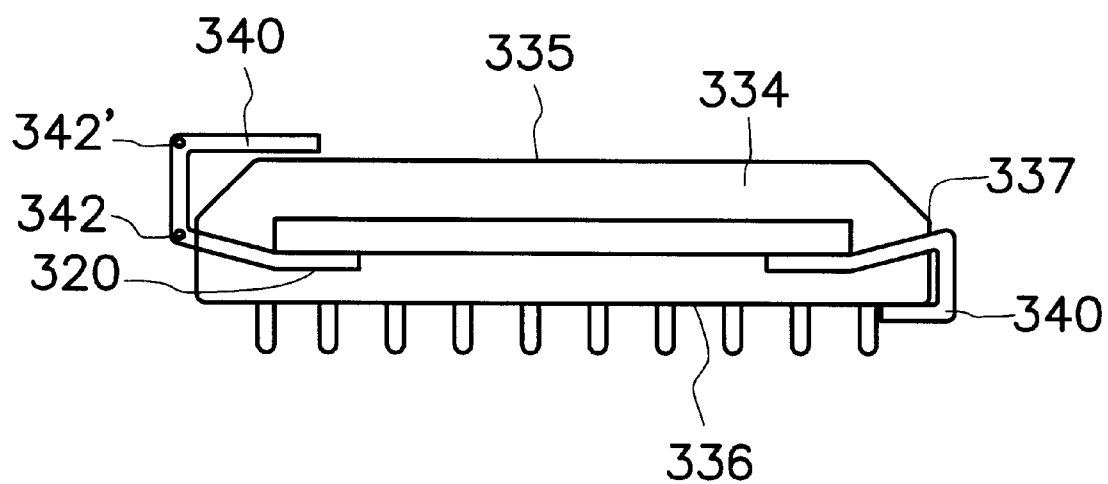
FIG. 6A is a schematic, cross-sectional, side view of a semiconductor package incorporating the lead frame as shown in FIG. 6.

FIG. 6A is a schematic, cross-sectional, side view of a semiconductor package incorporating the lead frame 300 as shown in FIG. 6. In FIG. 6A, a slot 342 is made in the heat slug 340 for ease of bending. Depth of the slot 342 can be further increased to form a hole. In addition, by increasing the width of the heat slug 340, the heat slug 340 can be bent to such a position that even the printed circuit board where the package stands is touched. Hence, another heat conduction path is established. The heat slug 340 can bend up or down so that part of the upper surface 335 or lower surface 336 is covered.

In either case, the amount of heat dissipated from the package is increased. To prevent a packaged IC from jamming inside track that leads to, for example, a testing or packaging station, an additional slot 342' can be added to the heat slug 340. Hence, heat slug can be bent into various shapes so that the ultimate package can be transported freely along all kinds of tracks without ever becoming stuck. Furthermore, the number of heat slug 340 and the area of each heat slug 340 can be varied depending on the amount of heat generated.

In summary, the advantages of this invention includes:
1. The additional heat slug on the lead frame can be bent around in a way that hides burrs on the exterior of the package. Therefore, IC packages are able to travel along tracks free from jams without having to remove burrs by performing additional operations using additional machines.
2. There is no need to append sophisticated radiators to the package through complicated processing operations for increasing the rate of heat dissipation. Just by incorporating one or more heat slugs into a lead frame, heat produced inside the package can be channeled to the heat slug and radiated away. Hence, the method is able to reduce cost and increase productivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead frame having a packaging area, comprising:
   a die pad within the packaging area;
   a plurality of leads around the die pad such that a portion of each lead is located inside the packaging area;
   a heat slug outside the packaging area; and
   a plurality of tie bars attached to the die pad so that at least one tie bar couples the die pad to the heat slug,
   wherein the heat slug is bent upward or downward around the package body so as to cover burrs formed on an exterior of the lead frame.

2. The lead frame of claim 1, wherein the lead frame further includes a pair of side rails such that the leads and the heat slug are supported by the side rails, and the tie bars that are not coupled to a heat slug are also supported by the side rails.

3. A semiconductor package, comprising:
   a die pad;
   a silicon chip mounted on top of the die pad;
   a plurality of leads around the silicon chip such that at least one of the leads are electrically connected to the silicon chip, and each lead is composed of an internal lead section and an external lead section;
   a plurality of tie bars coupled to the die pad;
   a package body that encloses the die pad, the silicon chip, the internal lead section of the leads and the tie bars; and
   a heat slug emerging from one side of the package body such that the heat slug is coupled to at least one tie bar,
   wherein the heat slug is bent around the package body so as to cover burrs formed on an exterior of the package body.

4. The semiconductor package of claim 3, wherein the package body has at lease six surfaces including a plurality of sides, an upper surface and a lower surface so that the external section of the leads and the heat slug emerge from the side of the package.

5. The semiconductor package of claim 4, wherein the heat slug bends up towards the upper surface of the package body.

6. The semiconductor package of claim 5, wherein the heat slug covers a portion of the upper surface.

7. The semiconductor package of claim 4, wherein the heat slug bends down towards the lower surface of the package body.

8. The semiconductor package of claim 7, wherein the heat slug covers a portion of the lower surface.

9. The semiconductor package of claim 3, wherein the heat slug contacts the printed circuit board when the package body sits on a printed circuit board.

10. A lead frame having a packaging area, comprising:
    a plurality of leads inside the packaging area;
    a plurality of supporting bars inside the packaging area; and
    a heat slug outside the packaging area but coupled to at least a supporting bar,
    wherein the heat slug is bent upward or downward around the package body.

11. The lead frame of claim 10, wherein the heat slug and the lead frame are coupled together at one or more connecting points.

12. A semiconductor package, comprising:
    a die pad;
    a lead frame for supporting a silicon chip; wherein the lead frame further includes:
        a plurality of leads, wherein a portion thereof is electrically coupled to the silicon chip, and each lead can be divided into an internal lead section and an external lead section;
        a plurality of supporting bars;
        a heat slug coupled to at least one supporting bar; and
        a package body that seals off the internal lead section of the leads, the supporting bars and the silicon chip,
        wherein the heat slug is bent around the package body.

13. The semiconductor package of claim 12, wherein should the package body sit on a printed circuit board, the heat slug contacts the printed circuit board when the package body sits on a printed circuit board.

14. The semiconductor package of claim 12, wherein the package body has at least six surfaces including a plurality of sides and an upper surface and a lower surface so that the external section of the leads and the heat slug emerge from the side of the package.

15. The semiconductor package of claim 14, wherein the heat slug bends up towards the upper surface of the package body.

16. The semiconductor package of claim 15, wherein the heat slug covers a portion of the upper surface.

17. The semiconductor package of claim 14, wherein the heat slug bends down towards the lower surface of the package body.

18. The semiconductor package of claim 17, wherein the heat slug covers a portion of the lower surface.

* * * * *